United States Patent
Kux et al.

(10) Patent No.: US 7,457,144 B2
(45) Date of Patent: Nov. 25, 2008

(54) MEMORY DEVICE AND METHOD FOR VERIFYING INFORMATION STORED IN MEMORY CELLS

(75) Inventors: Andreas Kux, Haar (DE); Detlev Richter, Munich (DE)

(73) Assignee: Qimonda Flash GmbH & Co. KG, Dresden (DE)

( * ) Notice: Subject to any disclaimer, the term of this patent is extended or adjusted under 35 U.S.C. 154(b) by 84 days.

(21) Appl. No.: 11/489,702

(22) Filed: Jul. 19, 2006

(65) Prior Publication Data

US 2008/0019187 A1    Jan. 24, 2008

(51) Int. Cl.
*G11C 17/00* (2006.01)
(52) U.S. Cl. ............... 365/94; 365/185.22; 365/185.03
(58) Field of Classification Search .............. 365/94, 365/185.22, 185.03
See application file for complete search history.

(56) References Cited

U.S. PATENT DOCUMENTS

| 6,005,805 | A | 12/1999 | Takeuchi |
| 6,011,725 | A | 1/2000 | Eitan |
| 6,377,488 | B1 | 4/2002 | Kim et al. |
| 6,871,258 | B2 * | 3/2005 | Micheloni et al. ........... 711/103 |

FOREIGN PATENT DOCUMENTS

JP    2006-185585    7/2006

* cited by examiner

*Primary Examiner*—Huan Hoang
(74) *Attorney, Agent, or Firm*—Slater & Matsil, L.L.P.

(57) ABSTRACT

A memory device comprises a plurality of first and second non-volatile memory cells arranged as an array. Each memory cell stores information. The memory device further comprises an access unit coupled to the array. The access unit stores information in the plurality of first and second non-volatile memory cells. The memory device further comprises a verifying unit coupled to the array. The verifying unit verifies the information stored in a group of the first and second memory cells by verifying only a subset of the group. The subset comprises at least one of the second memory cells.

33 Claims, 2 Drawing Sheets

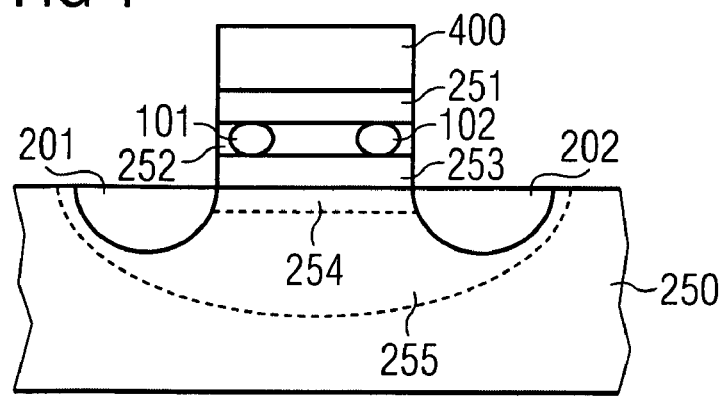
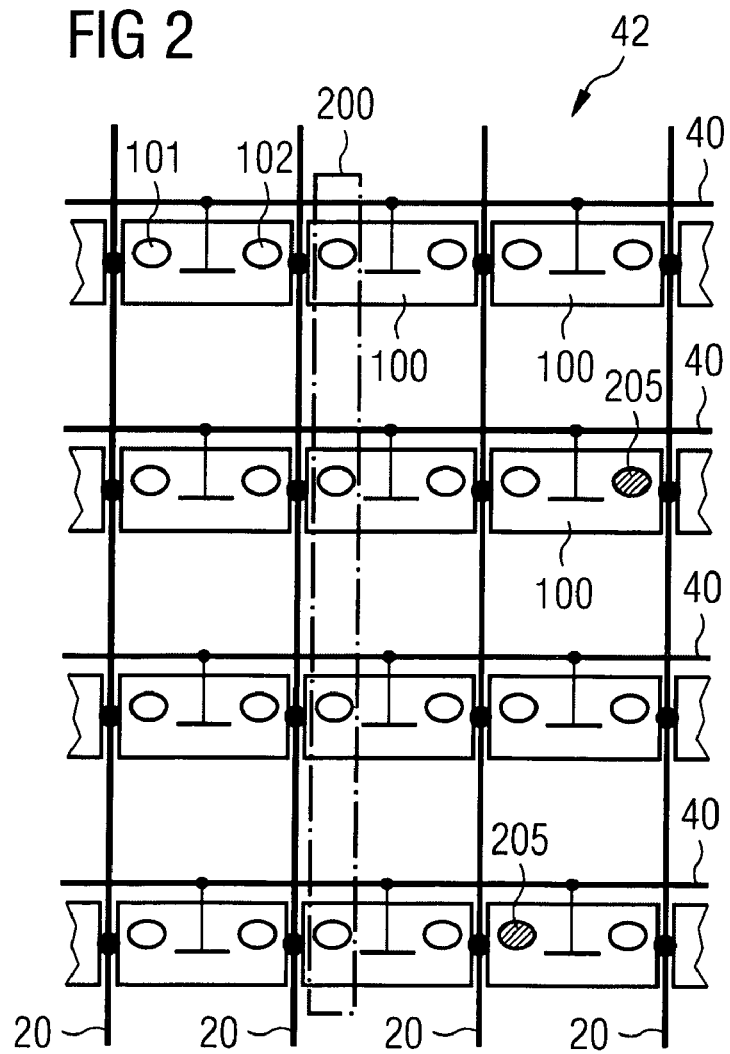

MEMORY DEVICE AND METHOD FOR VERIFYING INFORMATION STORED IN MEMORY CELLS

TECHNICAL FIELD

The present invention generally relates to a semiconductor memory device and a method to verify information.

BACKGROUND

An EEPROM or electrically erasable and programmable read only memory is a non-volatile storage unit used for example in computers or other devices. The EEPROM storage unit comprises a plurality of memory cells that can be programmed and erased electrically multiple times.

The EEPROM memory cell may be formed as a floating gate memory cell or as a so-called nitride programmable read only memory cell (NROM memory cell). Depending on the form of the memory cell, one or more bits can be stored in the memory cell.

Each memory cell comprises a transistor body having two terminals serving as source or drain. A gate electrode is arranged on the transistor body and a dielectric layer is located between the gate electrode and the transistor body.

The memory cells are usually arranged in an array having rows and columns. A multitude of memory cells is arranged in one of the rows and a multitude of memory cells is arranged in one of the columns.

The array may be organized in sectors. The gate electrodes of the memory cells located in a same row of the sector are coupled to a same wordline of a plurality of wordlines. The terminals of the memory cells located in a same column are coupled to a first bitline and to a second bitline, respectively. The first bitline and the second bitline are located on either side of these memory cells.

Access to each of these memory cells may be performed by applying access potentials, including reading potentials, programming potentials and erasing potentials, to the wordline and to the first and the second bitlines coupled to the memory cell to be accessed.

Erasing of the memory cells may be performed in parallel. The erasing potentials are applied to all wordlines and bitlines coupled to the memory cells of the erasing sector. Alternatively, the memory cells of a block may be erased in portions of the block. It also may be possible to read and program the memory cells located in the same row in parallel. The reading and programming potentials are applied to the wordline and selected bitlines that are coupled to the memory cells to be programmed or to be read. The reading potentials or the programming potentials are applied to the bitlines, located on either side of these memory cells, and to selected wordlines coupled to the memory cells to be read or to be programmed.

A special form of the EEPROM is a so-called flash memory that can be erased in parallel or block wise. Storing information in the memory cells of the flash memory is performed by first erasing all memory cells of the erasing sector. Then selected memory cells are programmed in order to store a bit pattern representing the information to be stored in the memory cells.

Programming and erasing is performed by applying the programming potentials and the erasing potentials, respectively, to the memory cells. The potentials are usually applied in pulses. Then a so-called full verifying step is performed in order to verify whether each of the memory cells to be programmed is programmed or whether each of the memory cells to be erased is erased. The actual erasing or programming step followed by the full verifying step is repeated until all memory cells are successfully verified, which means all memory cells to be erased are verified as erased or all memory cells to be programmed are verified as programmed.

Usually all memory cells of the erasing sector, including the memory cells that already have been erased before performing the first erasing step, are verified. Full verifying whether programming has been successfully performed is done in a similar way. In this case the group of memory cells to be programmed is verified.

The above-mentioned process for verification is very time consuming because each memory cell is verified. Furthermore, the process is energy consuming because verifying potentials are applied to each memory cell for verifying.

SUMMARY OF THE INVENTION

An embodiment of the invention includes a memory device, which includes a plurality of first and second non-volatile memory cells arranged as an array. Each memory cell stores information. The memory device also includes an access unit coupled to the array. The access unit stores information in the plurality of first and second non-volatile memory cells. The memory device also includes a verifying unit coupled to the array that verifies the information stored in a group of the first and second memory cells by verifying only a subset of the group. The subset includes at least one of the second memory cells.

BRIEF DESCRIPTION OF THE DRAWINGS

For a more complete understanding of the present invention and its advantages, reference is now made to the following description taken in conjunction with the accompanying drawings, in which:

FIG. 1 shows an NROM memory cell;
FIG. 2 shows a block diagram of a cut-out of an array.

DETAILED DESCRIPTION OF ILLUSTRATIVE EMBODIMENTS

Figure 3:
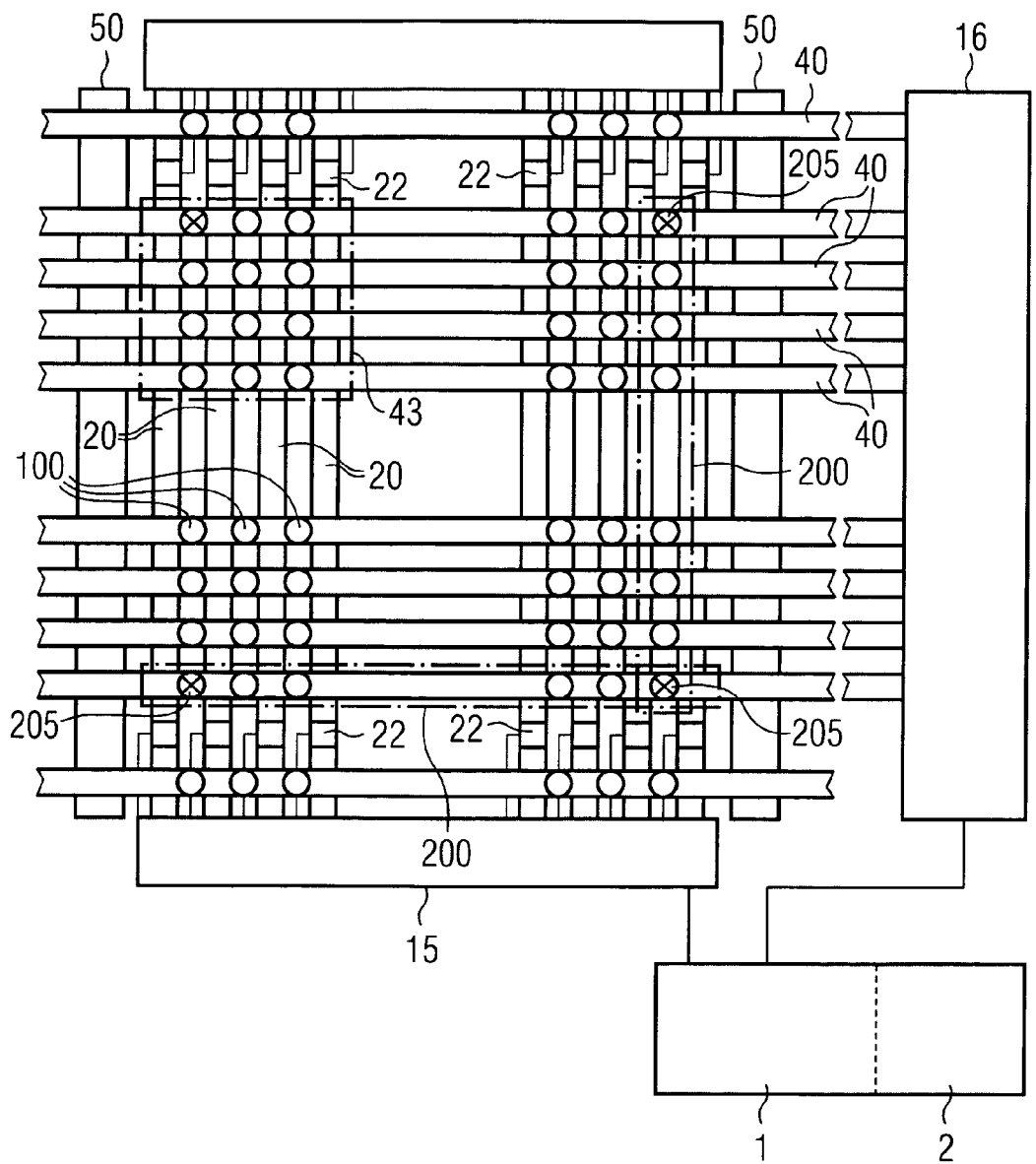
FIG. 3 shows a block diagram of a memory device.

By providing a memory device with verification restricted to a subset, the verifying step is sped up. Since the subset represents only a fraction of the group of bits to be verified embodiments of the invention describe ways to compensate for this and to come close to verifying accuracy of full verification.

In case of erasing, the group includes the memory cells of an erasing sector. This group includes second memory cells for which information is more difficult to store due to irregularities or asymmetries of the structure of the array which, for example, at a border area of the array. Irregularities comprise areas of the array where the regular structure of the memory cells is interrupted. For example, the memory cells of the array are arranged in several blocks. Separation areas are located between adjacent blocks. Even if the structure of the memory cell block arrangement seems symmetrical, the separation areas interrupt the regular arrangement of the memory cells. Thus, the outer memory cells of the blocks located adjacent to the irregularities formed by the separation areas are second memory cells.

The difficulty of storing may be caused by the structure of the access unit, especially means for coupling the access unit to the array. The means are formed, for example, as select transistors or connecting switches, which are connected to bitlines or wordlines. These structure irregularities influence the programming or erasing process in such a way that the information is stored with more difficulty in the second memory cells that are located adjacent to the structure irregularities. Performing the erasing or programming process, the second memory cells are the last cells that the information is stored in.

An embodiment of the invention further includes a plurality of wordlines coupled to the access unit and a plurality of bitlines arranged in groups. The bitlines also are coupled to the access unit. Each bitline includes at least one bitline contact. The memory device further comprises separation areas located between two groups of bitlines. Each memory cell of the plurality of the first and second memory cells is coupled to one of the plurality of the wordlines and to a first and a second bitline of the bitlines.

The separation areas and the bitline contacts are structure irregularities that influence the erasing and programming of the second memory cells located in areas of the memory cell array, which are located adjacent to these irregularities. The area of an embodiment includes second memory cells located adjacent to the irregularities. The embodiment may includes second memory cells coupled to a same wordline that is located adjacent to the bitline contacts, or to a same bitline that is located adjacent to one of the separation areas. Further irregularities are caused by dummy bitlines, which are not used for programming or erasing. The area of an alternative embodiment includes second memory cells that are not located directly nearby irregularities, e.g., memory cells that are located adjacent to the outer memory cells. A further embodiment includes second memory cells located adjacent to one of the irregularities and second memory cells that are not located directly nearby the irregularities.

The subset may include all second memory cells of the group or a fraction of the second memory cells. If the subset, including all second memory cells, is verified successfully, it is assumed that all memory cells of the group, including the first and the second memory cells, have been programmed or erased successfully. If the subset does not include all second memory cells of the group, statistical correction is used in an embodiment of the invention.

An advantage of an embodiment is that only the subset is verified. The verify level is set on the basis of statistical correction. It depends on the amount of memory cells of the subset in comparison of the amount of memory cells information has been stored in. The verify level differs from a verify level that would be used if all the memory cells of the group would be verified.

For statistical correction, the verifying unit of a further embodiment is operable to verify the information stored in one of the memory cells against a first verify level and against a second verify level. The first verify level is set on the basis of statistical correction. If the verifying unit merely verifies the memory cells of the subset, the first verify level is used. If the verifying unit verifies all memory cells of the group or of a further subset, including all second memory cells of the group, the second verify level is used.

The first verify level is less than the second verify level in order to verify a first information value representing the erased memory cell. If the programmed memory cell is verified, the second verify level is less than the first verify level. The difference between the first and the second verify level leaves a margin that ensures that all second memory cells have been programmed or erased. Nevertheless, the second verify level may be adapted compared to a full verification of the memory cells, if the further subset includes all second memory cells of the group.

Another embodiment of the invention includes a plurality of non-volatile memory cells arranged in an array. Each memory cell stores at least one bit of a plurality of first or second bits. An access unit is coupled to the array, which alters the binary values of the bits stored in the plurality of non-volatile memory cells. The binary value represented by the second bit is more difficult to alter due to a structure of the array or the access unit. The memory device further includes a verifying unit coupled to the array. The verifying unit verifies the binary values of a group of the first and second bits by verifying only a subset of the group. The subset includes at least one of the second bits. Each memory cell is coupled to one of a plurality of wordlines and to a first and a second bitline of a same group of bitlines.

Memory cells may comprise two bits. In case of memory cells that are formed as NROM cells, a left bit and a right bit are stored in different areas of the memory cells. The left bit is stored in a first area located adjacent to the first bitline and the right bit is stored in a second area located adjacent to the second bitline. Memory cells that are coupled to the same wordline located adjacent to bit contacts include two second bits. The left bits of memory cells that are coupled to the first bitline located adjacent to a separation area are second bits. If the memory cells are coupled to the second bitline, which is located adjacent to the separation area, the right bits of these memory cells are second bits.

The binary value of each bit is designated by a variable characteristic, for example, a threshold voltage, of the memory cell. The verifying unit is operable to verify a first and a second binary value for erased and programmed bits, respectively.

The verify levels of an advantageous embodiment can be adapted for statistical corrections. The verifying unit verifies the first binary value of each bit of the subset against the first verify level. The second binary value of each bit of the subset is verified against the second verify level. These verify levels differ from verify levels that would be used if full verifying would be performed. If full verifying is performed, the verifying unit verifies the first binary value of each bit of the group or of a further subset, including said subset, against a third binary level, which is less than the first verify level. If the second binary value of all memory cells of the group or the further subset is verified a fourth verify level less than the second verify level is used.

An embodiment of the invention includes a method for verifying information stored in a plurality of first and second non-volatile memory cells that are arranged as an array. Then the information stored in a group of the first and second memory cells is verified by verifying only a subset of the group. The subset includes at least one of the second memory cells.

In case of erasing, the group includes all memory cells of an erasing sector. In case of programming, the group only includes the memory cells that have to be programmed. In order to ensure that some of the memory cells of the subset have been programmed, scrambling or transformation, e.g., inverting, of the data may be performed.

If the subset includes all second memory cells of the group that are located in the area adjacent to structure irregularities of the array, successfully verifying of the subset infers that the first memory cells and the second memory cells store the desired information.

An embodiment of the invention includes a method with statistical correction in case the subset does not include all second memory cells of the group. Verifying all memory cells of a further subset, which includes said subset, or of the group, is performed against a second verify level differing from a first verify level used for said subset. The first and the second verify level differ by a margin for statistical correction. The subset includes a fraction of all second memory cells and the further subset may include all second memory cells. The margin ensures that all memory cells, including all second memory cells, store the information if only the subset is verified.

Another embodiment of the invention concerns verifying information stored in a plurality of non-volatile memory cells arranged in as array. Each memory cell stores at least one bit of a plurality of first and second bits. The bit represents a binary value. Each memory cell is coupled to one of a plurality of wordlines and to a first and to a second bitline of a plurality of bitlines. The method includes altering the binary value of a first group of the plurality of first and second bits, wherein the binary value of the second bit is more difficult to alter due to a structure of the array, and verifying the binary value of a second group by verifying only a subset of the second group. The subset includes at least one of the second bits.

In the case of erasing, the first group includes memory cells that are programmed before performing the erasing step. Nevertheless, the second group includes all memory cells of the erasing sector. In the case of programming, the first group includes the memory cells that are to be programmed and the second group includes the same memory cells.

A further embodiment of the invention includes a method including adjusting the verify levels for statistical correction. In this case the verify level used for verifying the subset differs from a verify level that would be used for full verifying.

Preferred embodiments are discussed in detail below. However, it should be noted that the present invention provides many applicable concepts that can be embodied in a wide variety of specific contexts. The specific embodiments discussed are merely illustrative of specific ways to make and use the invention and do not limit the scope of the invention.

FIG. 1 shows an embodiment of an NROM memory cell. The memory cell includes a transistor body with a cell well 255 that includes two doping areas 201, 202. A channel region 254 is located between the doping areas 201, 202. A gate electrode 400 is arranged above the channel region 254 insulated by an oxide-nitride-oxide layer 251, 252, 253, wherein the nitride layer 252 serves as a charge-trapping layer.

A right bit 102 and a left bit 101 can be stored within different areas of the charge-trapping nitride layer 252. The right bit 102 and the left bit 101 are indicated by two circles. If a certain amount of charge is trapped in one of these areas, the respective bit representing a logical 0 is called "programmed." If less than the certain amount of charge or no charge is trapped within this area, the respective bit is called "erased" and represents a logical 1.

The bits 101, 102 are programmed by means of hot electron programming. Programming the left bit 101 is performed by applying programming potentials to the first doping area 201 and to the gate electrode 400 while grounding the second doping area 202. Typically the programming potential of about 9 V is applied to the gate electrode 400 and the programming potential of about 4.5 V is applied to the first doping area 201. Thus, the electrons are injected and trapped into a left bit area, which is located adjacent to the first doping area 201. Likewise programming of the right bit 102 is performed by applying the programming potentials to the second doping area 202 and to the gate electrode 400 while grounding the first doping area 201. In this case, the electrons are injected and trapped into a right bit area. Typically the programming potentials are applied repeatedly in such a way that pulses of the programming potential are applied to the memory cell.

The amounts of charges trapped in the left bit area and in the right bit area affect a first threshold voltage and a second threshold voltage, respectively. The first threshold voltage designates the left bit 101 and the second threshold voltage designates the right bit 102.

For erasing an injection of hot holes generated by band-to-band tunnelling can be used. Erasing the left bit 101 is performed by applying erasing potentials to the gate electrode 400 or to the first doping area 201 and the gate electrode 400. Typically about 8 V are applied to the first doping area 201 and a negative voltage related to ground is applied to the gate electrode 400. The applied voltages result in a lateral field. Holes are caused to flow through the bottom oxide layer 253 for compensating the charge of the electrons that are trapped. The right bit 102 is erased by applying the respective erasing potentials to the gate electrode 400 and to the second doping area 202.

The bit is read by applying a reverse voltage between the first and second doping areas 201, 202 compared to the programming voltage that is used to program this bit. Typically a reading potential of about 1.5 V is applied to the second doping area 202 while grounding the first doping area 201 in order to read the left bit 101. A reading threshold voltage is adjusted by applying a respective reading potential to the gate electrode 400. Relatively small charges near the first doping area 201 prevent or reduce current flow. The current flows while there is no or nearly no trapped charge inside the left bit region. If the first threshold voltage is less than the reading voltage, the normal current flows, which is detectable. The left bit 101 is erased. If the first threshold voltage is larger than the reading voltage, no current or a current less than the normal current flows. The left bit 101 is programmed in this case. Reading the second bit 102 is performed by applying the respective reading potential to the first doping area 201 while grounding the second one 202.

FIG. 2 shows a block diagram of a cut-out 42 of a memory cell array comprising a plurality of memory cells 100. The left bit 101 and the right bit 102 are stored in each memory cell 100.

The memory cells 100 of the array are arranged in rows and columns. Each row comprises a plurality of memory cells 100 and each column comprises a plurality of memory cells 100.

Each of the memory cells 100 is coupled to a wordline 40 and to a first bitline 20 located on one side of the memory cell 100 and to a second bitline 20 located on the other side of this memory cell 100. The memory cells 100 arranged in a same one of the rows are coupled to a same wordline 40. The memory cells 100 arranged in a same one of the columns are coupled to a same first bitline 20 and to a same second bitline 20, which are located on either side of these memory cells 100.

Access to one of the memory cells 100 is performed by applying access potentials to the first and second bitlines 20 and the wordline 40 that memory cell 100 is coupled to. Access includes programming, erasing and reading.

Access to the memory cells 100 located in the same row is performed by applying the access potential to the wordline 40 and applying the access potentials to selected bitlines 20 that are coupled to the memory cells 100 accesses is performed to. Reading or programming in a row synchronistically is performed either to the left bits 101 or to the right bits 102 of the memory cells 100 located in that row.

Due to the symmetry of the cut-out 42 shown in FIG. 2 the programming and erasing conditions of the memory cells 100 are very similar.

Erasing is performed by applying a given number of erasing pulses to the memory cells 100. The threshold voltages designating the bits are decreased below the reading threshold voltage. Verifying the bits is performed by verifying the threshold voltages against a first erase verify level, which is less than the reading threshold voltage. This step is similar to the reading step, but the reading threshold voltage is decreased to the first erase verify level by adjusting the reading potential applied to the wordlines. Verifying against the first erase verify level ensures that the threshold voltage does not touch or cross the reading threshold voltage and may cause a read failure even in case of any type of margin loss of the memory cells. Such margin loss may occur from operating conditions like temperature or reliability stress like disturbances.

Some of the bits 205 may be harder to erase than most of the other bits. These bits are indicated in FIG. 2 by edging. Such bits and the respective memory cells that are hard to erase may be caused by a programming pattern or the manufacturing process. Further erasing pulses have to be applied to these memory cells to erase the respective bits 205. Conventionally the erasing step and the step of verifying all memory cells is repeated until all bits have been successfully verified, which means that they are erased. Similar problems may occur performing the programming step.

The hard to erase bits 205 may be detected by a test routine.

In order to save time only a subset 200 of the memory cells 100 is verified. The subset 200 may include a random sample of the memory cells 100, which possibly does not store any of the bits 205 that are hard to erase. If the subset 200 includes only so-called first bits, which are not hard to erase, as indicated in FIG. 2, verifying errors may occur. In this case all bits of the subset 200 are verified successfully against the first erase verify level, but the bits 205 that are hard to erase are still programmed because further erasing pulses are required. If these bits 205 are not to be programmed in the following programming step they cause read failures.

In order to avoid these failures, the bits of the subset 200 are verified against a second erase verify level, which is less than the first erase verify level. Thus, more erasing pulses are usually applied to all memory cells 100 that the threshold voltages exceed the second erase verify level. Hence the hard to erase bits 205 are likely to exceed the first erase verify level, which reduces the failure probability. This method for statistical correction can be used as long as, in the end, this does not cause failures that cannot be corrected by an error correction code ECC.

Larger statistical examples, for example, a full block under erase, come with a larger width of the threshold voltage distribution. Given a statistical model for the description of the subset, for example, a Gaussian distribution, it is possible to define an offset that needs to be used for taking the different distribution width into account.

Verifying programmed or erased memory cells can be done with a first program verify level or the first erase level making sure that the rest of the distribution will fall above the desired second program verify level or below the desired second erase verify level, respectively.

The probability of causing, once in a while, an over-programmed or an over-erased bit due to a distribution outliner bit from the subset, is higher than the probability that a bit is out of range in the full ensemble.

Programming is performed in a similar way. In order to verify the group of bits to be programmed only a subset of this group is verified against the second program verify level, which is above a first program verify level used for full verification.

FIG. 3 shows a block diagram of a charge-trapping memory device including an erasing sector. The erasing sector includes a multitude of memory cells 100. The memory device further includes a multitude of wordlines 40 and a multitude of bitlines 20. One of the wordlines 40 is connected to the electrodes of the memory cells 100 that are arranged in a same row. The memory cell 100 is located between two adjacent bitlines 20.

An access unit 1 includes a wordline decoder 16 coupled to the wordlines 40 and a bitline decoder 15 coupled to the bitlines 20. The bitlines 20 are arranged in groups. A separation area 50, which may be formed of insulating material, is located between two groups of bitlines 20.

FIG. 3 shows a section located between two separation areas 50 of the erasing sector. The whole erasing sector includes further sections having further memory cells 100 coupled to the same wordlines 40 as said section. The memory device usually includes further erasing sectors.

Each bitline 20 includes bitline contacts 22, which are connected to the bitline decoder 15. The bitline decoder 15 applies the reading, programming or erasing potentials to selected bitlines 20 by means of the bitline contacts 22.

The access potentials, including reading, programming, erasing and verifying potentials, can be applied to selected bitlines and wordlines that are coupled to the memory cells 100 to be accessed. Erasing is usually performed sector-by-sector. Programming, reading and verifying is usually performed row-by-row. The bitline decoder 15 and the wordline decoder 16 include switching means in order to select the bitlines 20 and wordlines 40 the access potentials are applied to.

The array section includes irregularities of the array structure. These irregularities come from the bitline contacts 22 and different distances between adjacent bitlines 20 and wordlines 40 resulting to blocks 43 of memory cells 100 within the section. Furthermore, the bitlines 20 located adjacent to the separation areas 50 are used to perform access only to one column of memory cells 100 that are located on one side of this bitline 20. Due to these significant systematic in bit-programmability, there are bits that are more difficult to erase or program.

Especially for a program operation, there can be significant systematic in bit programmability, for example, caused by effects origination from virtual ground architecture. There are certain bit positions that are programmed harder than other ones, if these bit positions are to be programmed due to a desired pattern.

The memory cells 100 that are located near the irregularities are more difficult to erase or to program. In particular the memory cells 100 located in the border area or especially in the corner of the array section are hard to erase or to program. The corner memory cells 205 indicated by a cross are coupled to the bitline 20 that is located adjacent to one of the separation areas 50 and to the wordline 40 that is located adjacent to the bitline contacts 22. Due to this position the bits, especially the bits stored in the area of the memory cell located adjacent to the outer bitlines 20 are hard to erase.

Appropriate subsets 200 for verifying include these memory cells 205 that are hard to erase or to program. A first subset 200 includes the bits stored in the memory cells 100, 205 connected to the wordlines 40 that are adjacent to the bitline contacts 22. A second subset 200 includes the memory cells 100, 205 coupled to the outer bitlines 20 located adjacent to the separation areas 50. The second subset 200 may merely include the left bits or the right bits of these memory cells 100. A third subset including all memory cells hard to erase includes the memory cells located in the border area of the section. A fourth subset includes the corner memory cells 205, which are very difficult to erase.

Verifying all bits hard to erase or very difficult to erase assures that any scattering of the threshold voltage resulting from technology is taken care of. It is assumed that all other bit positions come with the same technology scatter, so that the subset of bits to be verified are the last ones that cross the program verify level or the program erase level.

Combining the statistical approach with the above-mentioned method, the subset 200, like the first or the second subset, discloses only a group of all memory cells that are hard to erase. In this case, the memory cells of the subset or the respective bits are verified against the second verify level, which is below or above the erase or program verify level used for full verification.

In the end, a few tens or hundreds of bits will be sufficient to determine whether the programming or erasing step was successfully performed for a large group under the assumption that a small error correction code correctable fraction may cross the read level without causing a system read failure.

What is claimed is:

1. A memory device, comprising:
   a plurality of non-volatile memory cells arranged in an array, the plurality of non-volatile memory cells including first and second memory cells, each memory cell storing information;
   an access unit coupled to the array, the access unit causing usable information to be stored in the plurality of non-volatile memory cells; and
   a verifying unit coupled to the array, the verifying unit verifying the usable information stored in a group of the first and second memory cells by verifying only a subset of the group, the subset comprising at least one of the second memory cells.

2. The memory device according to claim 1, wherein the usable information is more difficult to store in one of the second memory cells than in one of the first memory cells.

3. The memory device according to claim 1, wherein the second memory cells are located in an area of the array that is located adjacent to irregularities of a structure of the array.

4. The memory device according claim 1, further comprising:
   a plurality of wordlines coupled to the access unit; and
   a plurality of bitlines coupled to the access unit, each bitline comprising at least one bitline contact;
   wherein each memory cell of the plurality of first and second memory cells is coupled to one of the plurality of wordlines and to a first and to a second bitline of the plurality of bitlines.

5. The memory device according to claim 4, wherein the second memory cells are coupled to a same wordline.

6. The memory device according to claim 4, further comprising a separation area located between groups of bitlines, wherein the second memory cells are coupled to a same bitline located adjacent to the separation area.

7. The memory device according to claim 1, wherein the subset comprises all second memory cells of the group.

8. The memory device according to claim 1, wherein the verifying unit verifies the information of the subset against a first verify level that depends on a number of cells the subset.

9. The memory device according to claim 1, wherein the information stored in the memory cells of the subset is scrambled or transformed.

10. A memory device, comprising:
    a plurality of non-volatile memory cells arranged in an array, the plurality of non-volatile memory cells including first and second memory cells, each memory cell storing information;
    an access unit coupled to the array, the access unit causing information to be stored in the plurality of non-volatile memory cells; and
    a verifying unit coupled to the array, the verifying unit verifying the information stored in a group of the first and second memory cells by verifying only a subset of the group, the subset comprising at least one of the second memory cells;
    wherein the verifying unit verifies the information of the subset against a first verify level that depends on a number of cells the subset; and
    wherein the verifying unit verifies the information of one of the memory cells against the first verify level or against a second verify level, wherein the verifying unit verifies each memory cell of a further subset, including said subset, or of the group against the second verify level, the first verify level being less than the second verify level in order to verify a first information value, the second verify level being less than the first verify level in order to verify a second information value.

11. A memory device, comprising:
    a plurality of non-volatile memory cells arranged in an array, each memory cell storing at least one bit of a plurality of first and second bits, each bit representing a binary value;
    an access unit coupled to the array, the access unit altering the binary values of the first and second bits stored in the plurality of non-volatile memory cells thereby storing usable data in the array, wherein the binary value represented by the second bit is more difficult to alter due to a structure of the array or the access unit; and
    a verifying unit coupled to the array, the verifying unit verifying the binary values of a group of the first and the second bits by verifying only a subset of the group, the subset comprising at least one of the second bits.

12. The memory device according to claim 11, wherein the second bits are stored in areas of the memory cells located adjacent to irregularities of the structure of the array.

13. The memory device according to claim 11, further comprising:
    a plurality of wordlines coupled to the access unit;
    a plurality of bitlines coupled to the access unit, the bitlines arranged in groups, each bitline comprising at least one bitline contact; and
    separation areas located between two groups of bitlines;
    wherein each memory cell is coupled to one of the plurality of wordlines and to a first and a second bitline of a same group of bitlines.

14. The memory device according to claim 13, wherein the second bits are stored in memory cells coupled to a same wordline located adjacent to the bitline contacts of the bitlines.

15. The memory device according to claim 13, wherein each memory cell stores a left bit and a right bit in a charge trapping layer, the left bit being stored in a first area of the memory cell located adjacent to the first bitline, the right bit being stored in a second area of the memory cell located adjacent to the second bitline.

16. The memory device according to claim 15, wherein the second bits comprise the left bits of the memory cells coupled to a same first bitline that is located adjacent to one of the separation areas.

17. The memory device according to claim 15, wherein the second bits comprise the right bits of the memory cells coupled to a same second bitline that is located adjacent to one of the separation areas.

18. The memory device according to claim 11, wherein the subset comprises all second bits of the group.

19. The memory device according to claim 11, wherein the verifying unit verifies a first binary value of the subset against a first verify level and verifies a second binary value of the subset against a second verify level, the first verify level and second verify level depending on the number of cells in the subset.

20. A memory device, comprising:
a plurality of non-volatile memory cells arranged in an array, each memory cell storing at least one bit of a plurality of first and second bits, each bit representing a binary value;
an access unit coupled to the array, the access unit altering the binary values of the bits stored in the plurality of non-volatile memory cells, wherein the binary value represented by the second bit is more difficult to alter due to a structure of the array or the access unit; and
a verifying unit coupled to the array, the verifying unit verifying the binary values of a group of the first and the second bits by verifying only a subset of the group, the subset comprising at least one of the second bits;
wherein the verifying unit verifies a first binary value of the subset against a first verify level and verifies a second binary value of the subset against a second verify level, the first verify level and second verify level depending on the number of cells in the subset; and
wherein the verifying unit verifies the first binary value of a further subset, comprising said subset, or of the group against a third verify level, and the verifying unit verifies the second binary value of the further subset, comprising said subset, or of the group against a fourth verify level, the first verify level being less than the third verify level, the second verify level being larger than the fourth verify level.

21. A method for verifying information stored in a plurality of first and second non-volatile memory cells arranged as an array, each memory cell of the plurality of first and second memory cells being coupled to one of a plurality of wordlines and to a first and to a second bitline of a plurality of bitlines, each memory cell storing information, the method comprising:
storing information in the plurality of first and second non-volatile memory cells, the information including data usable by circuitry outside the array; and
verifying the information stored in a group of the first and second memory cells by verifying only a subset of the group, the subset comprising at least one of the second memory cells.

22. The method according to claim 21, wherein the information is more difficult to store in one of the second memory cells than in one of the first memory cells.

23. The method according to claim 21, wherein the second memory cells are located in an area of the array that is located adjacent to structure irregularities of the array.

24. The method according to claim 21, wherein the verifying step comprises verifying the information of each memory cell of the subset against a first verify level that is set in dependency on the number of cells in the subset.

25. The method according to claim 21, wherein the data stored in the memory cells of the subset is scrambled or transformed before performing verifying.

26. A method for verifying information stored in a plurality of first and second non-volatile memory cells arranged as an array, each memory cell of the plurality of first and second memory cells being coupled to one of a plurality of wordlines and to a first and to a second bitline of a plurality of bitlines, each memory cell storing information, the method comprising:
storing information in the plurality of first and second non-volatile memory cells;
verifying the information stored in a group of the first and second memory cells by verifying only a subset of the group, the subset comprising at least one of the second memory cells, wherein the verifying step comprises verifying the information of each memory cell of the subset against a first verify level that is set in dependency on the number of cells in the subset; and
performing an additional verifying step that comprises verifying the information of each memory cell of a further subset, including said subset, or of the group against a second verify level, the first verify level being less than the second verify level in order to verify a first information value, the second verify level being less than the first verify level in order to verify a second information value.

27. The method according to claim 26, wherein the subset comprises a fraction of all second memory cells and the further subset comprises all second memory cells.

28. A method for verifying information stored in a plurality of non-volatile memory cells arranged as an array, each memory cell storing at least one bit of a plurality of first and second bits, the bit representing a binary value, each memory cell of the plurality of memory cells being coupled to one of a plurality of wordlines and to a first and to a second bitline of a plurality of bitlines, the method comprising:
storing data in the array by altering the binary values of a first group of the plurality of first and second bits, wherein the binary value of the second bit is more difficult to alter due to a structure of the array;
verifying the binary value of a second group by verifying only a subset of the second group, the subset comprising at least one of the second bits; and
after verifying, retrieving the stored data from the array.

29. The method according to claim 28, wherein the second bits of the second group are stored in memory cells located in an area of the array that is located adjacent to structure irregularities of the array.

30. The method according to claim 28, wherein each memory cell stores a left bit and a right bit, the left bit being stored in a first area of the memory cell located adjacent to the first bitline, the right bit being stored in a second area of the memory cell located adjacent to the second bitline, the subset comprising the left bits of memory cells coupled to a same first bitline adjacent to the structure irregularities of the array.

31. The method according to claim 28, wherein each memory cell stores a left bit and a right bit, the left bit being stored in a first area of the memory cell located adjacent to the first bitline, the right bit being stored in a second area of the memory cell located adjacent to the second bitline, the subset comprising the right bits of memory cells coupled to a same second bitline adjacent to the structure irregularities of the array.

32. The method according to claim 28, wherein the bit is designated by a characteristic of the memory cell and the verifying step comprises verifying a first binary value of each bit of the subset against a first verify level or the verifying step comprises verifying a second binary value of each bit of the subset against a second verify level, the first verify level and second verify level are set in dependency on the magnitude of the subset.

33. A memory device, comprising:
- a plurality of non-volatile memory cells arranged in an array, each memory cell storing at least one bit of a plurality of first and second bits, each bit representing a binary value;
- an access unit coupled to the array, the access unit altering the binary values of the bits stored in the plurality of non-volatile memory cells, wherein the binary value represented by the second bit is more difficult to alter due to a programming pattern used to provide information to the array; and
- a verifying unit coupled to the array, the verifying unit verifying the binary values of a group of the first and the second bits by verifying only a subset of the group, the subset comprising at least one of the second bits.

* * * * *